US007554416B2

(12) United States Patent
Lee et al.

(10) Patent No.: US 7,554,416 B2
(45) Date of Patent: Jun. 30, 2009

(54) MULTI-BAND LC RESONANCE VOLTAGE-CONTROLLED OSCILLATOR WITH ADJUSTABLE NEGATIVE RESISTANCE CELL

(75) Inventors: Ja Yol Lee, Daejeon (KR); Kwi Dong Kim, Daejeon (KR); Chong Ki Kwon, Daejeon (KR); Jong Dae Kim, Daejeon (KR); Sang Heung Lee, Daejeon (KR); Kyoung Ik Cho, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/542,288

(22) Filed: Oct. 2, 2006

(65) Prior Publication Data
US 2007/0132522 A1   Jun. 14, 2007

(30) Foreign Application Priority Data
Dec. 8, 2005 (KR) .................. 10-2005-0119516
Jun. 20, 2006 (KR) .................. 10-2006-0055270

(51) Int. Cl.
*H03B 7/06*   (2006.01)
*H03C 3/22*   (2006.01)
*H03L 1/00*   (2006.01)

(52) U.S. Cl. ............... 331/115; 331/15; 331/36 C; 331/109; 331/117 FE; 331/177 V; 331/183; 331/186

(58) Field of Classification Search ............... 331/36 C, 331/115, 117 R, 117 FE, 132, 177 V, 15, 331/109, 182, 183, 186
See application file for complete search history.

(56) References Cited

U.S. PATENT DOCUMENTS
5,142,251 A * 8/1992 Boomer ................. 331/116 FE
5,805,029 A * 9/1998 Theus et al. ........... 331/116 FE
5,963,100 A   10/1999 Tolson et al.

(Continued)

FOREIGN PATENT DOCUMENTS
JP   2005-236482   9/2005

(Continued)

*Primary Examiner*—Robert Pascal
*Assistant Examiner*—Levi Gannon
(74) *Attorney, Agent, or Firm*—Ladas & Parry LLP

(57) ABSTRACT

Provided is an LC resonance voltage-controlled oscillator (VCO) used for a multi-band multi-mode wireless transceiver. In order to generate a multi-band frequency, a capacitor bank and a switchable inductor are included in the LC resonance voltage-controlled oscillator. The LC resonance voltage-controlled oscillator employs an adjustable emitter-degeneration negative resistance cell in place of tail current sources in order to compensate for non-uniform oscillation amplitude caused by the capacitor bank and prevent the degradation of a phase noise due to the tail current sources. The LC resonance voltage-controlled oscillator includes an inductor providing an inductance element partially determining the frequency of an oscillation wave; a discrete capacitor bank providing a capacitance element partially determining the frequency of the oscillation wave and being discretely determined by a control bit signal; and a discrete negative resistance cell providing a negative resistance element that is discretely determined by the control bit signal, to keep the amplitude of the oscillation wave constant.

9 Claims, 6 Drawing Sheets

U.S. PATENT DOCUMENTS

| | | |
|---|---|---|
| 6,559,730 B1 | 5/2003 | Marvin et al. |
| 6,593,826 B2 | 7/2003 | See |
| 6,661,301 B2 | 12/2003 | Traub |
| 6,778,022 B1 | 8/2004 | Zhang et al. |
| 6,876,266 B2 | 4/2005 | Koo et al. |
| 7,161,442 B2 * | 1/2007 | Hong et al. ............. 331/113 R |
| 2003/0146795 A1 * | 8/2003 | Albon et al. ............. 331/36 C |
| 2004/0183606 A1 * | 9/2004 | Komurasaki et al. .... 331/117 R |
| 2004/0242175 A1 | 12/2004 | Lin |
| 2005/0046506 A1 | 3/2005 | Yang et al. |

FOREIGN PATENT DOCUMENTS

| | | |
|---|---|---|
| KR | 1019940010541 | 5/1994 |
| KR | 1020040078533 | 9/2004 |
| KR | 1020040085629 | 10/2004 |
| WO | WO 00/70741 | 11/2000 |

* cited by examiner

MULTI-BAND LC RESONANCE VOLTAGE-CONTROLLED OSCILLATOR WITH ADJUSTABLE NEGATIVE RESISTANCE CELL

CROSS-REFERENCE TO RELATED APPLICATION

This application claims priority to and the benefit of Korean Patent Application Nos. 2005-119516, filed Dec. 8, 2006, and 2006-55270, filed Jun. 20, 2006, the disclosures of which are incorporated herein by reference in their entirety.

BACKGROUND

1. Field of the Invention

The present invention relates to a multi-band inductor-capacitor (LC) resonance voltage-controlled oscillator (VCO) and, more specifically, to a multi-band LC resonance voltage-controlled oscillator that operates in a multi-band multi-mode and compensates for fluctuation in the amplitude of an oscillation wave.

2. Discussion of Related Art

It is difficult to embody a wide-band LC resonance voltage-controlled oscillator in a multi-band multi-mode wireless transceiver. Nowadays, capacitor banks 122-1 and 122-2 and varactors 121 are mounted in an LC resonance portion with a fixed inductor 130 as shown in FIG. 1, in order to extend the frequency adjustment range of the wide-band LC resonance voltage-controlled oscillator.

Although FIG. 1 shows capacitors of the capacitor banks 122-1 and 122-2 arranged to increase as powers of two in the LC resonance voltage-controlled oscillator, they may be arranged as powers of any positive integer or in various other manners. Thus, the capacitance of the capacitor banks 122-1 and 122-2 is determined by control bit signals V0, V1, V2, and V3 of FIG. 1 so that a signal with a desired frequency can be generated by the LC resonance voltage-controlled oscillator of FIG. 1.

However, since the capacitance of the capacitor banks 122-1 and 122-2 is dependent on the control bit signals V0, V1, V2, and V3, when the oscillation signal frequency and amplitude of the LC resonance oscillator are different or, in the worst case, when the capacitance of the selected capacitor banks 122-1 and 122-2 is too high, oscillation may cease to occur. This phenomenon results from non-uniform oscillation amplitude and oscillation stop, which arise due to a certain load driving current of the oscillator as well as variation in the capacitance of the capacitor banks 122-1 and 122-2 in response to the control bit signals V0, V1, V2, and V3. In order to prevent non-uniform oscillation amplitude and oscillation stop, a plurality of tail current sources 190 for LC resonance are connected in parallel as shown in FIG. 1. The tail current sources 190 are turned on/off in response to the control bit signals V0, V1, V2, and V3 that determine the capacitance of the capacitor banks 122-1 and 122-2. The following Equation 1 expresses a noise element of the oscillator:

$$F = 1 + \frac{4\gamma IR}{\pi V_s} + \frac{4\gamma g_m R}{9}, \quad (1)$$

wherein "g" denotes a channel noise coefficient, "I" denotes a bias current, "Vs" denotes an oscillation signal amplitude, "R" denotes an LC resonance load resistance, and "gm" denotes the transconductance of a transistor of the tail current source 190. From Equation 1, it can be seen that the noise element "F" of the oscillator is proportional to the bias current "I" and the transconductance "gm" and inversely proportional to the oscillation signal amplitude "Vs."

As described above, a band switching technique using capacitors or inductors has been used in order to extend the frequency adjustment range of the LC resonance voltage-controlled oscillator. In this case, fluctuation in amplitude of the oscillation frequency signal occurs relative to the capacitance of a switching capacitor. In order to compensate for this fluctuation in the oscillation amplitude, the current of the tail current source 190 is increased. However, the tail current source 190 brings about low- and high-frequency thermal noise, thus increasing the phase noise of the LC resonance voltage-controlled oscillator.

SUMMARY OF THE INVENTION

The present invention is directed to a wide-band LC resonance voltage-controlled oscillator with an improved phase noise characteristic.

Also, the present invention is directed to a wide-band LC resonance voltage-controlled oscillator, which suppresses phase noise caused by a tail current source that is adopted for controlling fluctuation in oscillation amplitude.

Further, the present invention is directed to a wide-band LC resonance voltage-controlled oscillator, which suppresses noise caused by a tail current source while compensating for oscillation amplitude.

One aspect of the present invention provides an inductor providing an inductance element partially determining the frequency of an oscillation wave; a discrete capacitor bank providing a capacitance element partially determining the frequency of the oscillation wave and being discretely determined by a control bit signal; and a discrete negative resistance cell providing a negative resistance element that is discretely determined by the control bit signal, to keep the amplitude of the oscillation wave constant.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

In order to fundamentally remove low- and high-frequency noise caused by tail current sources included in a conventional voltage-controlled oscillator, an LC resonance voltage-controlled oscillator according to the present invention includes several negative resistance cells and voltage regulators instead of tail current sources to compensate for fluctuation in oscillation amplitude.

Before exemplary embodiments of the present invention are described, certain terms used herein will be defined. It will be understood that a capacitor refers to any unit with capacitance irrespective of whether it is fixed, discrete, continuous, or variable, a continuous-variable capacitor refers to a unit (e.g., a varactor) with a continuously, linearly variable capacitance, a discrete capacitor bank refers to a unit with a discretely variable capacitance, and a fixed capacitor refers to a unit with a fixed capacitance like a typical capacitor. The above definitions shall be applied likewise to an inductor, a continuous-variable inductor, a discrete inductor bank, a fixed inductor, a continuous-variable resistor, a discrete resistor bank, a fixed resistor, and a discrete resistor. But, a resistor will be referred to as a resistance cell.

The present invention will now be described more fully hereinafter with reference to the accompanying drawings, in which exemplary embodiments of the invention are shown. This invention may, however, be embodied in different forms and should not be construed as limited to the exemplary embodiments set forth herein. Rather, these exemplary embodiments are provided so that this disclosure is thorough and complete and fully conveys the scope of the invention to those skilled in the art.

Exemplary Embodiment 1

Figure 1:
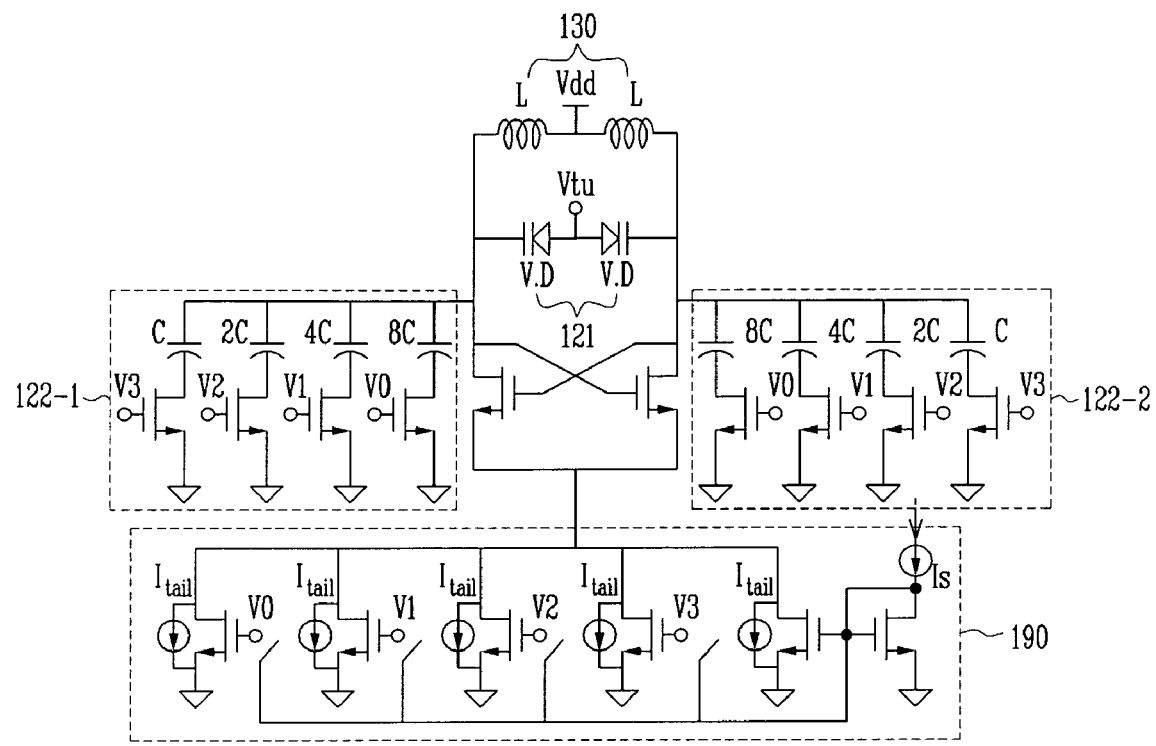
FIG. 1 is a circuit diagram of a conventional multi-band LC resonance voltage-controlled oscillator with a capacitor bank and a tail current bank.
Figure 2:
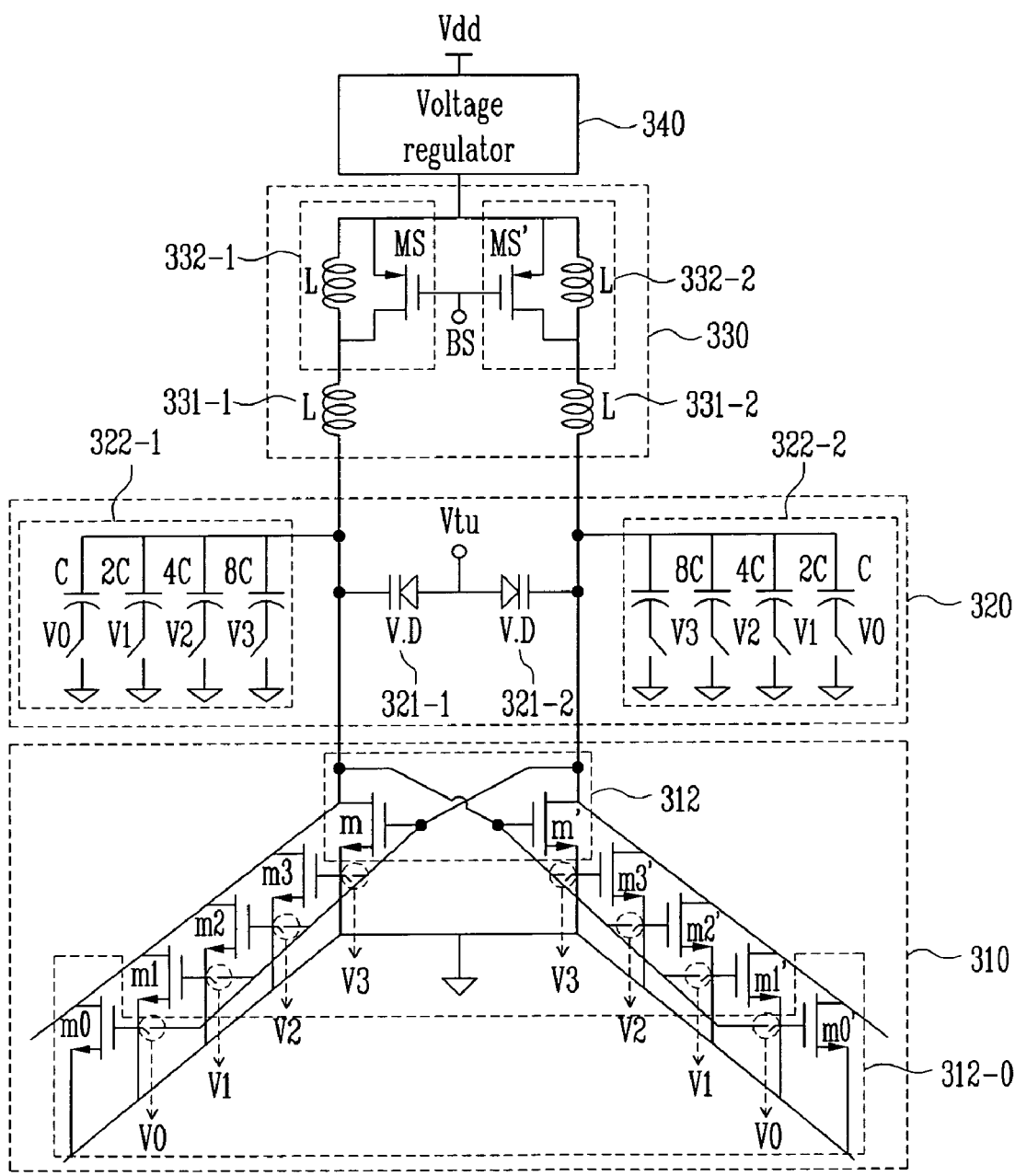
FIG. 2 is a circuit diagram of a multi-band LC resonance voltage-controlled oscillator with an adjustable negative resistance cell according to an exemplary embodiment of the present invention.

FIG. 2 is a circuit diagram of a wide-band LC resonance voltage-controlled oscillator 300 according to an exemplary embodiment of the present invention.

Referring to FIG. 2, the LC resonance voltage-controlled oscillator 300 includes an inductor 330, a capacitor 320, a discrete negative resistance cell 310, and a voltage regulator 340. Specifically, the inductor 330 provides an inductance element and the capacitor 320 provides a capacitance element that together determine the frequency of an oscillation wave. The discrete negative resistance cell 310 provides a discretely determined negative resistance element to keep the amplitude of the oscillation wave constant. Also, the voltage regulator 340 keeps a voltage applied from a power supply voltage terminal to the inductor 330 constant.

The inductor 330 includes a first inductor 332-1 and 331-1 and a second inductor 332-2 and 331-2, which are connected to the voltage regulator 340 and have different current paths. The capacitor 320 includes a first discrete capacitor bank 322-1 and a second discrete capacitor bank 322-2, which are connected to the first inductor 332-1 and 331-1. Also, the capacitances of the first and second discrete capacitor banks 322-1 and 322-2 are discretely determined by external control bit signals V0 to V3.

The discrete negative resistance cell 310 is located between a connection node between the first inductor 332-1 and 331-1 and the first discrete capacitor bank 322-1 and a connection node between the second inductor 332-2 and 331-2 and the second discrete capacitor bank 322-1. Thus, a negative resistance between both connection nodes is discretely determined by the external control bit signals V0 to V3.

Further, the first inductor is configured with a first discrete inductance bank 332-1 and a first fixed inductor 331-1, while the second inductor is configured with a second discrete inductance bank 332-2 and a second fixed inductor 331-2. The capacitor 320 may further include a first varactor 321-1 and a second varactor 321-2 whose capacitances are continuously determined by a control voltage Vtu. The first and second fixed inductors 331-1 and 331-2 are used to provide fixed inductance elements, and the first and second discrete inductor banks 332-1 and 332-2 are used to provide inductance elements that are discretely determined by an inductance control bit signal BS. In FIG. 2, each of the first and second inductors is comprised of one inductor and a switching MOS transistor MS (or MS') providing a bypass to the inductor.

As shown in FIG. 2, the LC resonance voltage-controlled oscillator according to the present exemplary embodiment provides two LC oscillation paths from the power supply voltage terminal to a ground voltage terminal. The first inductor 332-1 and 331-1, the first discrete capacitor bank 322-1, and the first varactor 321-1 form one LC oscillation path, and the second inductor 332-2 and 331-2, the second discrete capacitor bank 322-2, and the second varactor 321-2 form the other LC oscillation path.

The voltage regulator 340 compensates for change in a power supply voltage Vdd so that a constant current can flow through the LC resonance voltage-controlled oscillator 300.

The first and second discrete inductor banks 332-1 and 332-2 are turned on or off in response to the inductance control bit signal BS, which turns on/off gates of the switching MOS transistors MS and MS'. Since the switching MOS transistors MS and MS' are PMOS transistors, when the inductance control bit signal BS is 1, the switching MOS transistors MS and MS' are turned off to cut off the flow of current. On the other hand, when the inductance control bit signal BS is 0, the switching MOS transistors MS and MS' are turned on to allow the flow of current. When the switching MOS transistors MS and MS' are turned on in response to the inductance control bit signal BS, only the first and second fixed inductors 331-1 and 331-2 are directly connected to the voltage regulator 340, so that the wide-band LC resonance voltage-controlled oscillator 300 generates an oscillation signal in a high frequency band region of 7 to 10 GHZ. When the switching MOS transistors MS and MS' are turned off in response to the inductance control bit signal BS, the first and second fixed inductors 331-1 and 331-2 are connected to the voltage regulator 340 through the first and second inductor banks 332-1 and 332-2, so that the wide-band LC resonance voltage-controlled oscillator 300 generates an oscillation frequency signal in a low frequency band region of 3 to 6 GHz. The frequency of the oscillation signal generated in the aforementioned process is given by Equations 2 and 3:

$$f_o = \frac{1}{2\pi\sqrt{L(C_{bank} + C_{var})}}, \text{ for } BS = 1 \qquad (2)$$

$$f_o = \frac{1}{2\pi\sqrt{2L(C_{bank} + C_{var})}}, \text{ for } BS = 0, \qquad (3)$$

wherein $f_o$ denotes the oscillation frequency, $C_{bank}$ denotes a capacitor bank, and $C_{var}$ denotes the capacitance of a varactor.

In the LC resonance voltage-controlled oscillator 300, each of the first and second discrete capacitor banks 322-1 and 322-2 is comprised of four or more capacitors whose capacitances are the same or increase as powers of two (as shown in FIG. 2) or of some other positive integer. The first and second discrete capacitor banks 322-1 and 322-2 are turned on or off in response to the control bit signals V0, V1, V2, and V3, and discretely adjust the oscillation frequency of the LC resonance voltage-controlled oscillator 300. In the LC resonance voltage-controlled oscillator 300, the first and second varactors 321-1 and 321-2 continuously adjust the oscillation frequency of the LC resonance voltage-controlled oscillator 300 due to a loop filter output voltage Vtu of a phase locked loop (PLL).

Figure 3:
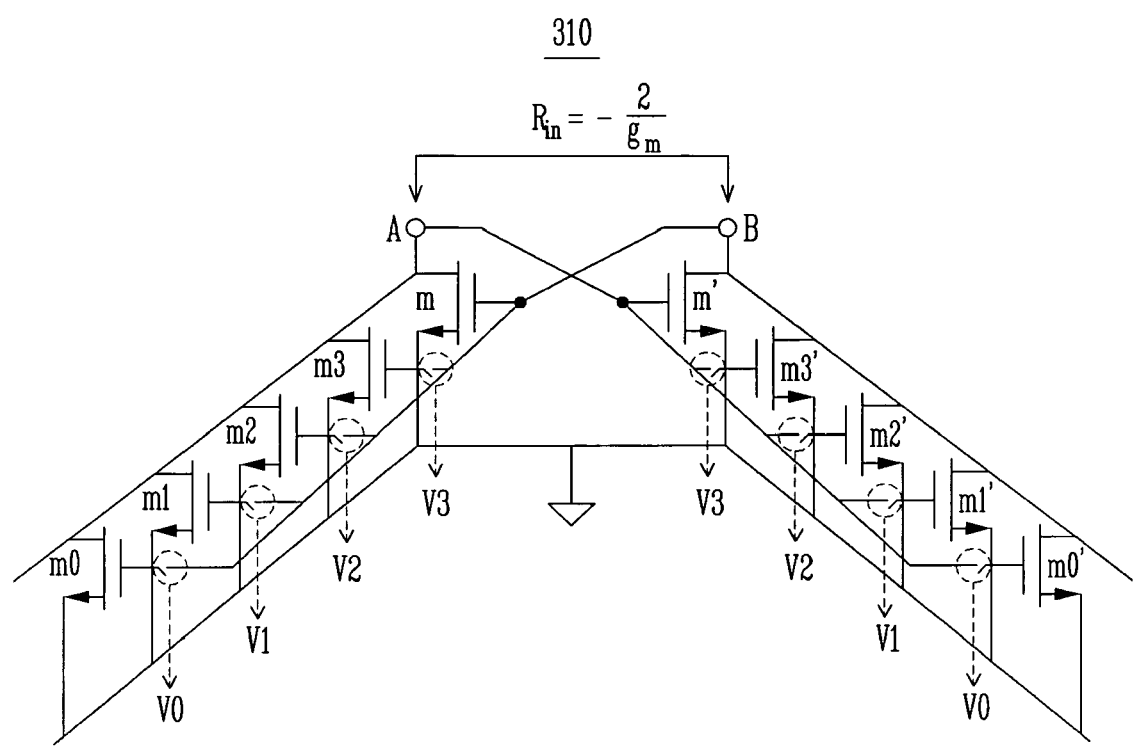
FIG. 3 is a detailed circuit diagram of the adjustable negative resistance cell shown in FIG. 2.

In the wide-band LC resonance voltage-controlled oscillator 300, the negative resistance cell 310 is configured with a pair of fixed resistors m and m' and four pairs of MOS transistors m0, m0', m1, m1', m2, m2', m3, and m3' for variable negative resistors. The MOS transistors m0, m0', m1, m1', m2, m2', m3, and m3' for variable negative resistors are turned on or off in response to the control bit signals V0, V1, V2, and V3. Each of the MOS transistors m0, m0', m1, m1', m2, m2', m3, and m3' has a gate connected to a switch and is turned on or off. FIG. 3 is a detailed circuit diagram of the negative resistance cell 310 shown in FIG. 2.

The input resistance of the negative resistance cell 310 at an A-B node of FIG. 3 can be expressed as shown in Equation 4:

$$R_{in} = -\frac{2}{g_m} = -\frac{2}{\mu C_{ox}\left(\frac{W}{L}\right)(V_{GS} - V_t)} \quad (4)$$

In Equation 4, an input negative resistance is inversely proportional to the transconductance of the negative resistance cell 310. In other words, as a transconductance, an aspect ratio (W/L) and a drain current increase, input negative conductance (1/Rin) increases, so oscillation intensity increases. The oscillation condition of a parallel resonance oscillation circuit can be expressed as shown in Relation 5:

$$\frac{1}{R_{in}} \rangle \frac{1}{R_T}, \quad (5)$$

wherein "$R_T$" denotes the parallel resistance of the LC resonance circuit at resonance. As can be seen from Relation 5, as the input negative resistance decreases, i.e., as the transconductance "$g_m$" increases, the negative conductance increases, so an oscillation amplitude also increases.

In the present exemplary embodiment, the MOS transistors m0, m0', m1, m1', m2, m2', m3, and m3' of the negative resistance cell 310 may have aspect ratios which are the same or increase as powers of two or some other positive integer, like the first and second discrete capacitor banks 322-1 and 322-2. When the MOS transistors m0, m0', m1, m1', m2, m2', m3, and m3' have the same aspect ratio, an accurate aspect ratio can be obtained, so that the compensation for the oscillation amplitude can be made more precisely. On the other hand, when the MOS transistors m0, m0', m1, m1', m2, m2', m3, and m3' have aspect ratios, which increase as powers of two or some other positive integer like the first and second discrete capacitor banks 322-1 and 322-2 as shown in FIG. 2, the control bit signals V0, V1, V2, and V3 used for the first and second discrete capacitor banks 322-1 and 322-2 can be employed likewise for turn-off control.

Operation of the LC resonance voltage-controlled oscillator 300 shown in FIG. 2 will now be described in more detail. The wide-band LC resonance voltage-controlled oscillator 300 using the negative resistance cell 310 as shown in FIG. 2 selectively generates a high-band group of oscillation frequencies (7 to 10 GHz) and a low-band group of oscillation frequencies (3 to 6 GHz) in response to the inductance control bit signal BS, which turns on or off the gate of the MOS transistor shown in FIG. 2, generates subbands belonging to the high- and low-band groups in response to the control bit signals V0~V3, which discretely control the first and second discrete capacitor banks 322-1 and 322-2 of the LC resonance voltage-controlled oscillator 300, and can continuously adjust an oscillation frequency in response to the control voltage Vtu of the first and second varactors 321-1 and 321-2. In other words, one of the high- and low-band groups is selected in response to the inductance control bit signal BS, a subband is selected out of the selected group in response to the control bit signals V0~V3, and an oscillation frequency is finally determined within the range of the selected subband in response to the control voltage Vtu.

In the present exemplary embodiment, the resistance of the negative resistance cell 310 is dependent on the number of parallel-connected MOS transistors to which a turn-on voltage is applied. The LC resonance voltage-controlled oscillator 300 includes two LC paths, which are current paths from the power supply voltage terminal Vdd to the ground voltage terminal. One of the LC paths includes the first inductor 332-1 and 331-1 and the first discrete capacitor bank 322-1, while the other includes the second inductor 332-2 and 331-2 and the second discrete capacitor bank 322-2. The varactors 321-1 and 321-2 and the discrete negative resistance cell 310 are connected between one connection node between the first inductor 332-1 and 331-1 and the first discrete capacitor bank 322-1 and the other connection node between the second inductor 332-2 and 331-2 and the second discrete capacitor bank 322-1. To form a basic scheme of the oscillator 300, one pair m and m' of the MOS transistors m0, m0', m1, m1', m2, m2', m3, and m3' of the discrete negative resistance cell 310 are connected as a cross-coupled pair between the connection nodes and the ground voltage terminal. Other pairs of MOS transistors for negative resistors connected in response to the control bit signals V0~V3 are provided as cross-coupled pairs.

When the first and second discrete capacitor banks 322-1 and 322-2 of the LC resonance voltage-controlled oscillator 300 are discretely switched on/off, the negative resistance cell 310 of the LC resonance voltage-controlled oscillator 300 is discretely switched on/off to compensate for fluctuation in oscillation amplitude. In other words, the control bit signals V0~V3 used for the first and second discrete capacitor banks 322-1 and 322-2 serve to switch on/off the negative resistance cell 310. Variation in the negative resistance of the negative resistance cell 310 counterbalances variation in the oscillation amplitude caused by variation in the capacitance of the first and second discrete capacitor banks 322-1 and 322-2, so that an oscillation wave with a constant amplitude can be generated irrespective of frequency. Unlike in the conventional case, the LC resonance voltage-controlled oscillator 300 employs no tail current sources. Thus, since the LC resonance voltage-controlled oscillator 300 may be sensitive to variation of an input power supply voltage, the LC resonance voltage-controlled oscillator 300 may include the voltage regulator 340 to stabilize the power supply voltage. As mentioned above, the LC resonance voltage-controlled oscillator 300 includes the negative resistance cell 310 and the voltage regulator 340 in place of the tail current sources, thus preventing degradation in phase noise caused by the noise of the tail current sources and compensating for fluctuation in oscillation amplitude.

Exemplary Embodiment 2

Figure 4:
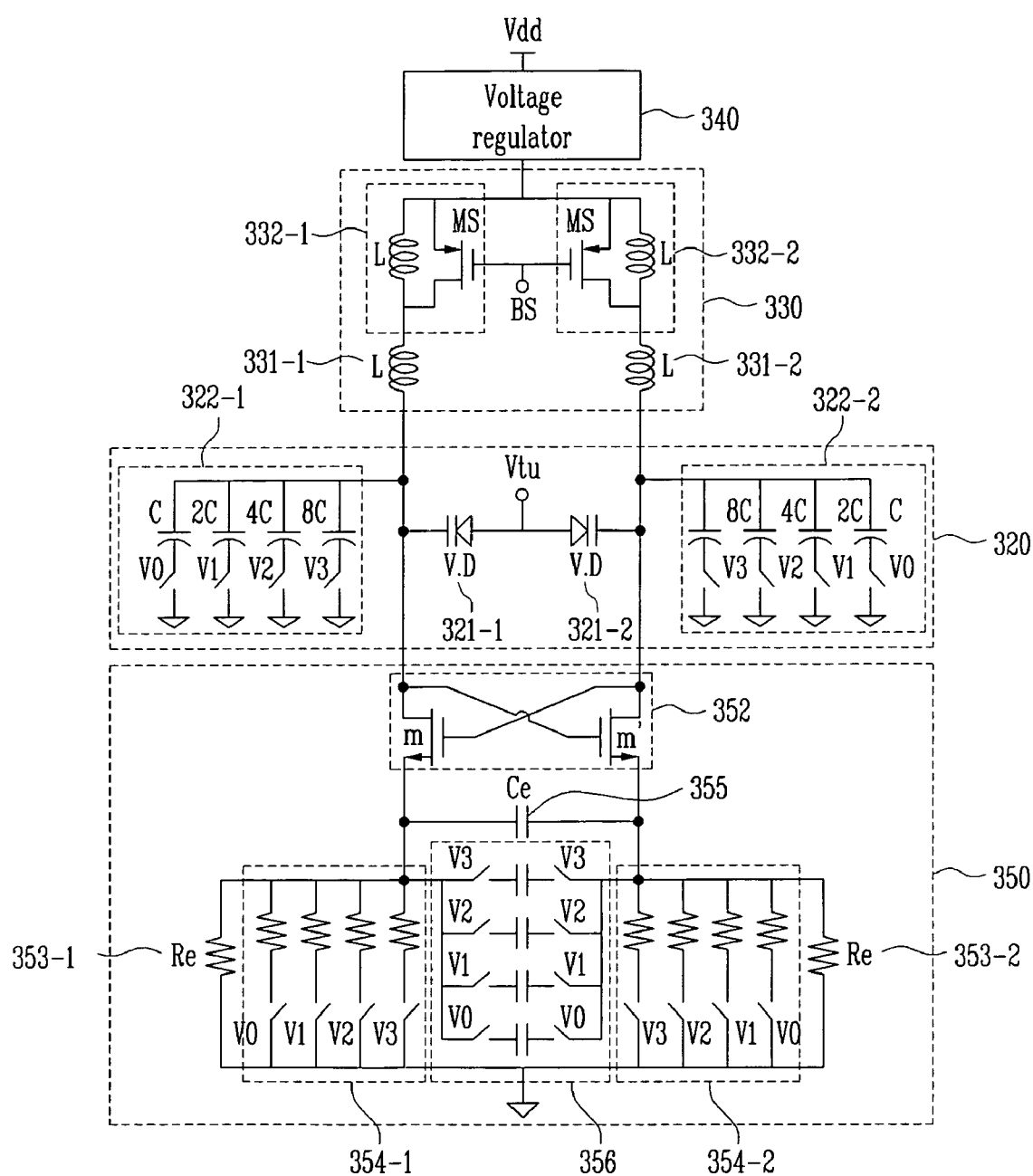
FIG. 4 is a circuit diagram of a multi-band LC resonance voltage-controlled oscillator with an adjustable degeneration negative resistance cell according to another exemplary embodiment of the present invention.

FIG. 4 is a circuit diagram of a wide-band LC resonance voltage-controlled oscillator 301 including an emitter-degeneration coupled pair 352 in addition to a negative resistance cell 350 according to another exemplary embodiment of the present invention.

Referring to FIG. 4, the LC resonance voltage-controlled oscillator 301 includes a voltage regulator 340, an inductor 330, first and second discrete capacitors 322-1 and 322-2, and first and second varactors 321-1 and 321-2, which perform almost the same functions as those of FIG. 2. A first inductor 332-1 and 331-1, the first discrete capacitor bank 322-1, and the first varactor 321-1 form one LC oscillation path, while a second inductor 332-2 and 331-2, the second discrete capacitor bank 322-2, and the second varactor 321-2 form the other LC oscillation path.

In the present exemplary embodiment, the LC resonance voltage-controlled oscillator 301 is structurally characterized by the emitter-degeneration coupled pair 352 comprised of two MOS transistors m and m' provided between the two LC oscillation paths, degeneration resistors 353-1, 353-2, 354-1, and 354-2 connected between the emitter-degeneration coupled pair 352 and a ground voltage terminal, and degeneration capacitors 355 and 356 connected between two emitter nodes of the emitter-degeneration coupled pair 352. In other words, a negative resistance cell 350 of the LC resonance voltage-controlled oscillator 301 of the present exemplary embodiment is configured with a degeneration capacitor "Ce", a degeneration resistor "Re", and a degeneration cross-coupled pair "m".

The degeneration resistor "Re" includes at least one fixed degeneration resistor 353-1 and 353-2 and the degeneration capacitor "Ce" includes at least one capacitor 355 in order for the emitter-degeneration coupled pair 352 to function. The discrete degeneration capacitor bank 356 includes unit capacitors whose capacitances are the same or increase as powers of two or some other positive integer like the first and second discrete capacitor banks 322-1 and 322-2. Also, each of the discrete capacitor banks 322-1 and 322-2 includes unit resistors whose resistances are the same or increase as powers of two or some other positive integer like the first and second discrete capacitor banks 322-1 and 322-2. When the unit capacitors of the discrete degeneration capacitor bank 356 have the same capacitance and the unit resistors of each of the discrete capacitor banks 322-1 and 322-2 have the same resistance, accurate capacitance and resistance can be obtained.

The emitter-degeneration cross-coupled pair of the negative resistance cell 350 shown in FIG. 4 can oscillate at a higher frequency range and exhibits a better phase-noise characteristic than the cross-coupled pair of the discrete negative resistance cell 310 of FIG. 2. In the emitter-degeneration cross-coupled pair of the negative resistance cell 350 of FIG. 4, the capacitance of the degeneration capacitor "Ce" and the resistance of the degeneration resistor "Re" affect a negative resistance, phase noise, and oscillation frequency. Thus, in the emitter-degeneration cross-coupled pair of the negative resistance cell 350 of FIG. 4, phase noise and the amplitude of an oscillation frequency signal can be adjusted by switching on or off the degeneration capacitor bank 356 and a degeneration resistor bank 354. In FIG. 4, a negative loop partially occurs at a low frequency range in the degeneration resistor Re of the negative resistance cell 350, so that conversion of low-frequency noise into phase noise can be lessened to some extent as shown in Equation 6:

$$v_{nb} = \frac{v_{nf}}{1 + A_{v1}}, \quad (6)$$

wherein "vnf" denotes a low-frequency noise source at a gate of the cross-coupled pair of the negative resistance cell 350, "vnb" denotes a low-frequency noise voltage induced between gate and source terminals due to the low-frequency noise source "vnf", and "Av1" denotes a low-frequency voltage gain of a transistor of the cross-coupled pair of the negative resistance cell 350.

In the emitter-degeneration cross-coupled pair of the negative resistance cell 350 shown in FIG. 4, the degeneration resistor Re and the degeneration capacitor Ce generate an input negative resistance given by Equation 7:

$$R_{in} = -[R_e // (1/\omega C_e)] \quad (7)$$

As can be seen from Equation 7, the amplitude of the oscillation frequency signal can be controlled by switching on/off the degeneration resistor bank 354 and the degeneration capacitor bank 356.

Exemplary Embodiment 3

Figure 5:
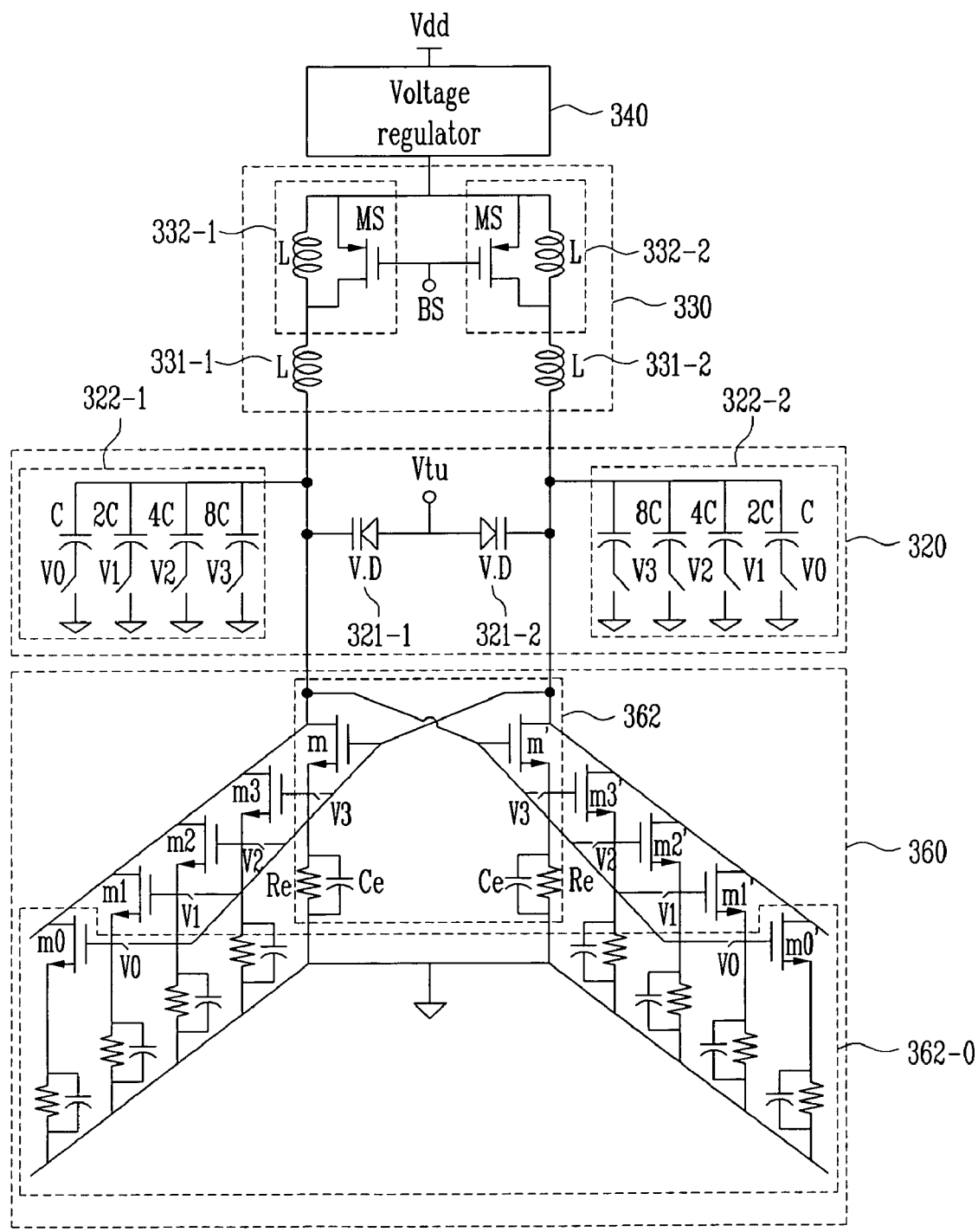
FIG. 5 is a circuit diagram of a multi-band LC resonance voltage-controlled oscillator with an adjustable degeneration negative resistance cell according to still another exemplary embodiment of the present invention.

FIG. 5 is a circuit diagram of a wide-band LC resonance voltage-controlled oscillator 302 with an adjustable emitter-degeneration negative resistance cell 360 according to still another exemplary embodiment of the present invention.

Referring to FIG. 5, the negative resistance cell 360 includes a plurality of unit discrete negative resistance cells that are connected in parallel in response to control bit signals V0~V3. Each of the unit discrete negative resistance cells 362-0 is comprised of a pair of unit MOS transistors m, m', m0, m0', ~m3, and m3', a unit resistor, and a unit capacitor. The pair of unit MOS transistors m, m', m0, m0', ~m3, and m3' are configured as an emitter-degeneration coupled pair in which one drain is connected to the other source, and have drains connected to a connection node between an inductor and a discrete capacitor bank. The unit resistor is connected in series to the pair of unit MOS transistors m, m', m0, m0', ~m3, and m3', and the unit capacitor is connected in parallel to the unit resistor. At least one unit resistance cell 362 of the negative resistance cell 360 may be always connected to an LC path.

The adjustable emitter-degeneration negative resistance cell 360 of FIG. 5 is constructed by applying an emitter-degeneration method to the adjustable negative resistance cell 310 of FIG. 2. Since the operating characteristics of the negative resistance cell 360 are almost the same as described with reference to FIGS. 2 and 4 a description thereof will not be repeated here.

In FIG. 5, MOS transistors of the unit resistance cell 362 of the negative resistance cell 360 may have aspect ratios which are the same or increase as powers of two or some other positive integer. When the MOS transistors have aspect ratios that increase as powers of two or some other positive integer, unit degeneration resistors of the unit resistance cell 362 should have resistances that increase as powers of two or some other positive integer, and unit capacitors of the unit resistance cell 362 also should have capacitances that increase as powers of two or some other positive integer. Further, each of the unit degeneration resistors and each of the unit capacitors may be set to optimal resistance and capacitance, respectively, at an oscillation frequency that is selected and generated in response to the control bit signals V0~V3. As described above, an emitter degeneration resistor "Re" is used to stabilize a bias voltage and suppress low-frequency noise.

Exemplary Embodiment 4

Figure 6:
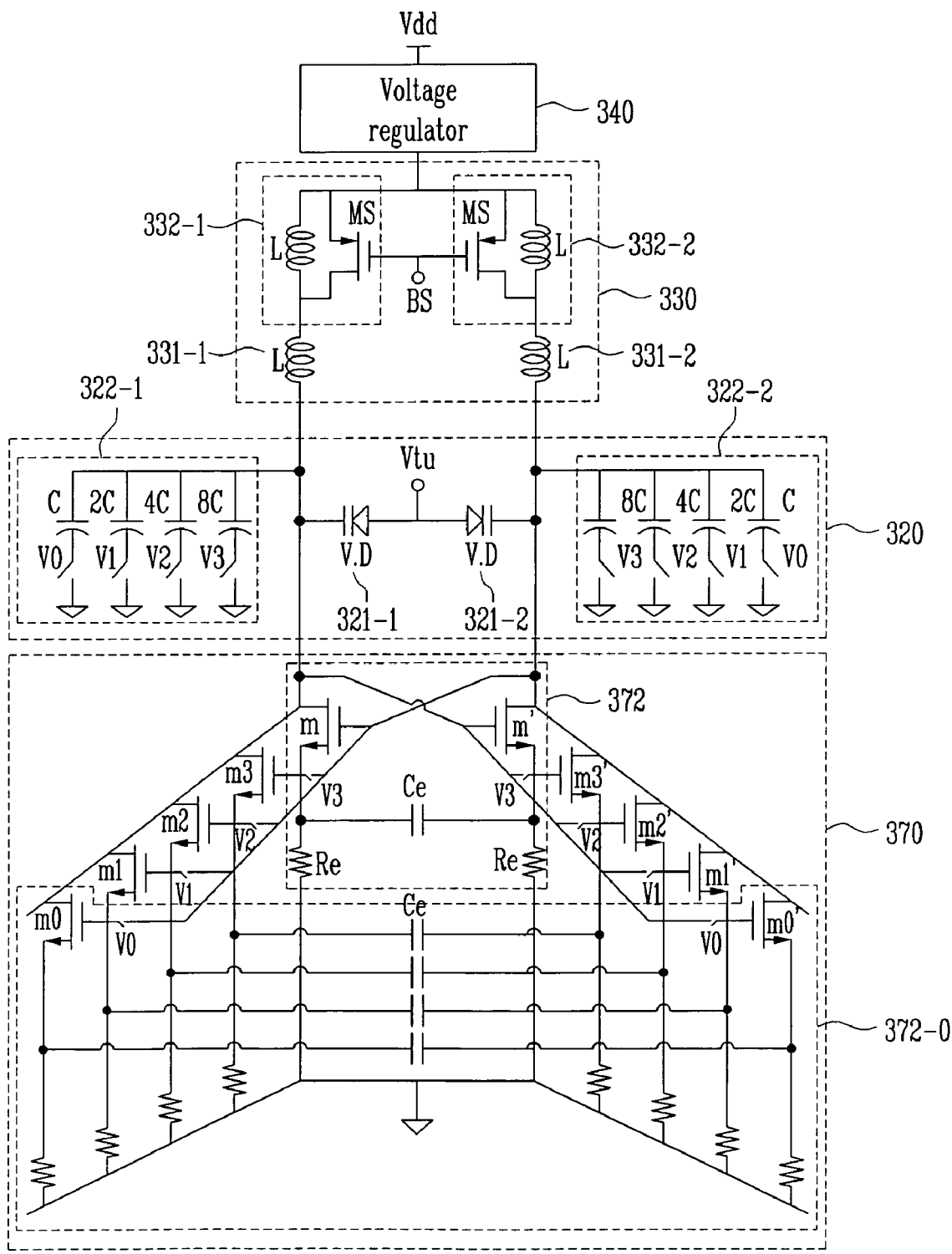
FIG. 6 is a circuit diagram of a multi-band LC resonance voltage-controlled oscillator with an adjustable degeneration negative resistance cell according to yet another exemplary embodiment of the present invention.

FIG. 6 is a circuit diagram of a wide-band LC resonance voltage-controlled oscillator 303 with an adjustable emitter-degeneration negative resistance cell 370 according to yet another exemplary embodiment of the present invention.

Referring to FIG. 6, the negative resistance cell 370 is comprised of a plurality of unit discrete negative resistance cells that are connected in parallel in response to control bit signals V0~V3. Each of the unit discrete negative resistance cells 372-0 is comprised of a pair of unit MOS transistors m, m', m0, m0', ~m3, and m3', a unit resistor, and a unit capacitor. The pair of unit MOS transistors m, m', m0, m0', ~m3, and m3' are configured as an emitter-degeneration coupled pair in which one drain is connected to the other source, and have drains connected to a connection node between an inductor and a discrete capacitor bank. The unit resistor is connected in series to the pair of unit MOS transistors m, m', m0, m0', ~m3, and m3', and the unit capacitor is located between sources of the pair of unit MOS transistors m, m', m0, m0', ~m3, and m3'. At least one unit resistance cell 372 of the negative resistance cell 370 may be always connected to an LC path.

Degeneration capacitors m and m' of FIG. 6 are equivalent in circuit configuration to degeneration capacitors of FIG. 5. The adjustable emitter-degeneration negative resistance cell 370 of FIG. 6 is constructed by applying an emitter-degeneration method to the adjustable negative resistance cell 310 of FIG. 2. Since the operating characteristics of the negative resistance cell 370 are almost the same as described with reference to FIGS. 2 and 4, a description of those operation characteristics will not be repeated here.

In FIG. 6, MOS transistors of the unit resistance cell 372 of the negative resistance cell 370 may have aspect ratios which are the same or increase as powers of two or some other positive integer. When the MOS transistors have aspect ratios that increase as powers of two or some other positive integer, unit degeneration resistors of the unit resistance cell 372 should have resistances that increase as powers of two or some other positive integer, and unit capacitors of the unit resistance cell 372 also should have capacitances that increase as powers of two or some other positive integer. Further, each of the unit degeneration resistors and each of the unit capacitors may be set to optimal resistance and capacitance, respectively, at an oscillation frequency that is selected and generated in response to the control bit signals V0~V3. As described above, an emitter degeneration resistor "Re" is used to stabilize a bias voltage and suppress low-frequency noise.

According to the exemplary embodiments of the present invention as described above, an LC resonance voltage-controlled oscillator includes a negative resistance cell, with the result that fluctuation in oscillation amplitude generated during switching-on/off of a capacitor bank for multi-band oscillation can be sufficiently compensated for, and increase in phase noise can be prevented.

Typical exemplary embodiments of the invention have been disclosed in the drawings and specification. Although specific terms have been employed, they are intended to be taken in a generic and descriptive sense only and are not for purposes of limitation. The scope of the invention is set forth in the following claims. Therefore, it will be understood by those of ordinary skill in the art that various changes in form and details may be made to the disclosed exemplary embodiments without departing from the spirit and scope of the present invention as defined by the following claims.

What is claimed is:

1. An LC resonance voltage-controlled oscillator comprising:
   an inductor providing an inductance element partially determining the frequency of an oscillation wave;
   a discrete capacitor bank providing a capacitance element partially determining the frequency of the oscillation wave and being discretely determined by a control bit signal; and
   a discrete negative resistance cell providing a negative resistance element that is discretely determined by the control bit signal, to keep the amplitude of the oscillation wave constant,
   wherein the respective control bit signal determined to discretely turn on the respective capacitance element corresponds to the respective control bit signal to discretely turn on the negative resistive element irrespective of the frequency of the oscillation wave.

2. The oscillator according to claim 1, wherein the inductor comprises a first inductor and a second inductor having different current paths,
   wherein the discrete capacitor bank comprises a first discrete capacitor bank connected to the first inductor and a second discrete capacitor bank connected to the second inductor, and
   wherein the discrete negative resistance cell is located between a connection node between the first inductor and the first discrete capacitor bank and a connection node between the second inductor and the second discrete capacitor bank.

3. The oscillator according to claim 2, wherein each of the first and second inductors comprises:
   a fixed inductor providing a fixed inductance element; and
   a discrete inductance bank providing an inductance element that is discretely determined by an inductance control bit signal.

4. The oscillator according to claim 2, further comprising a continuous-variable capacitor providing a capacitance element that is continuously determined by a control voltage.

5. The oscillator according to claim 2, further comprising a voltage regulator for keeping a voltage applied to the inductor constant.

6. The oscillator according to claim 2, wherein the discrete negative resistance cell comprises a plurality of unit negative resistance cells, each unit negative resistance cell including a pair of MOS transistors configured as a cross-coupled pair in which one drain is connected to the other gate, the pair of MOS transistors located between a connection node between the inductor and the discrete capacitor bank and a ground voltage terminal,
   wherein the unit negative resistance cells are switched on/off in response to the control bit signal.

7. The oscillator according to claim 2, wherein the discrete negative resistance cell comprises:
   an emitter-degeneration coupled pair formed on two LC paths;
   a discrete degeneration capacitor bank located between two LC paths and having a capacitance that is discretely determined in response to the control bit signal; and
   a discrete degeneration resistor included in each of the two LC paths and having a resistance that is discretely determined in response to the control bit signal.

8. The oscillator according to claim 2, wherein the discrete negative resistance cell comprises a plurality of unit negative resistance cells, each unit negative resistance cell including:
 a pair of unit MOS transistors configured as an emitter-degeneration coupled pair in which one drain is connected to the other gate, the pair of unit MOS transistors having drains or gates connected to a connection node between the inductor and the discrete capacitor bank;
 a unit resistor connected in series to the pair of unit MOS transistors; and
 a unit capacitor connected in parallel to the unit resistor,
 wherein the unit negative resistance cells are switched on/off in response to the control bit signal.

9. The oscillator according to claim 2, wherein the discrete negative resistance cell comprises a plurality of unit negative resistance cells, each unit negative resistance cell including:
 a pair of unit MOS transistors configured as an emitter-degeneration coupled pair in which one drain is connected to the other source, the pair of unit MOS transistors having drains connected to a connection node between the inductor and the discrete capacitor bank;
 a unit resistor connected in series to the pair of unit MOS transistors; and
 a unit capacitor located between connection nodes between the unit MOS transistors and the unit resistor,
 wherein the unit negative resistance cells are switched on/off in response to the control bit signal.

* * * * *